(12) United States Patent
Ide et al.

(10) Patent No.: US 9,042,133 B2
(45) Date of Patent: May 26, 2015

(54) PRINTED CIRCUIT BOARD

(75) Inventors: Takeshi Ide, Kamakura (JP); Daishiro Sekijima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/981,487

(22) PCT Filed: Jan. 24, 2012

(86) PCT No.: PCT/JP2012/051904
§ 371 (c)(1),
(2), (4) Date: Jul. 24, 2013

(87) PCT Pub. No.: WO2012/105461
PCT Pub. Date: Aug. 9, 2012

(65) Prior Publication Data
US 2013/0301319 A1    Nov. 14, 2013

(30) Foreign Application Priority Data
Feb. 2, 2011    (JP) .................................. 2011-020570

(51) Int. Cl.
| H02H 7/125 | (2006.01) |
| H02M 1/12 | (2006.01) |
| H02M 1/44 | (2007.01) |
| H03H 7/38 | (2006.01) |

(52) U.S. Cl.
CPC .............. *H02H 7/1252* (2013.01); *H02M 1/12* (2013.01); *H02M 1/44* (2013.01); *H02M 2001/123* (2013.01); *H03H 7/38* (2013.01)

(58) Field of Classification Search
USPC ................................................ 363/39, 44–48
See application file for complete search history.

(56) References Cited

U.S. PATENT DOCUMENTS

| 4,999,594 | A | | 3/1991 | Ingman | |
| 5,148,360 | A | * | 9/1992 | Nguyen | ........................... 363/48 |
| 5,237,492 | A | * | 8/1993 | King | ............................... 363/46 |
| 5,530,638 | A | * | 6/1996 | Wu | .................................. 363/16 |
| 8,129,989 | B2 | | 3/2012 | Ide | |
| 2013/0114305 | A1 | * | 5/2013 | Ide et al. | .......................... 363/17 |

FOREIGN PATENT DOCUMENTS

JP    2008-078844 A    4/2008

OTHER PUBLICATIONS

International Preliminary Report on Patentability Notice for International Application No. PCT/JP2012/051904, dated Aug. 15, 2013.

\* cited by examiner

*Primary Examiner* — Jessica Han
(74) *Attorney, Agent, or Firm* — Fitzpatrick, Cella, Harper & Scinto

(57) ABSTRACT

A power source circuit includes a switching circuit 4 that converts a direct current voltage obtained by converting an alternating voltage from an alternating power source input through a pair of power supply lines 2 and 3 into a predetermined direct current voltage by a switching operation. A fuse 5 is provided on one power supply line 2. A series circuit 9 including a first line bypass capacitor 7 and a resistor element 8 is connected between one power supply line 2 and a ground 6. A second line bypass capacitor 10 is connected between the other power supply line 3 and the ground 6. Imbalance of the circuit by an excess current protection element is prevented to reduce common mode noise.

3 Claims, 4 Drawing Sheets

PRINTED CIRCUIT BOARD

TECHNICAL FIELD

The present invention relates to a power source circuit that reduces a high frequency noise generated by a switching operation.

BACKGROUND ART

Conventionally, an electronic instrument includes a power conversion circuit for converting frequency or voltage of any input power source into those of a power source for various devices in the electronic instrument. In particular, a switching method is widely used for size reduction and higher efficiency. However, in the power source circuit using the switching method, a switching operation generates a high frequency switching noise, and the noise causes terminal noise or unwanted electromagnetic waves.

As a noise filter that reduces such unwanted electromagnetic waves, PTL 1 discloses a line bypass capacitor (hereinafter referred to as a "Y capacitor"). FIG. 7 illustrates an example of a filter circuit used in a conventional switching power source circuit. The filter circuit 100 illustrated in FIG. 7 includes Y capacitors 104 and 105 connected between a power supply line of each of a pair of power supply lines 101 and 102 and the ground (hereinafter referred to as "GND") 103. The Y capacitors 104 and 105 remove common mode components of a high frequency switching noise generated from a switching element onto the GND 103, and reduce terminal noise or unwanted electromagnetic waves.

Two power supply lines connected from an input power source to the GND generally have the same impedance so that the two power supply lines are in balance with the GND. For example, in the filter circuit 100 illustrated in FIG. 7, the two Y capacitors 104 and 105 have the same capacitance value to keep balance.

However, in order to prevent failure of a circuit element, a switching power source includes an excess current protection element (for example, fuse) on an input side of a Y capacitor on one of two power supply lines connected from an input power source. The excess current protection element has a higher inductance than circuit wiring. Thus, if a switching frequency increases with decreasing size and increasing efficiency of the switching power source, an impedance by an inductance of the excess current protection element increases to increase imbalance between the two power supply lines. If there is imbalance between the two power supply lines, a normal mode component of the high frequency noise flowing through the two power supply lines is converted into a common mode component, thereby increasing common mode noise.

CITATION LIST

Patent Literature

PTL 1: Japanese Patent Application Laid-Open No. 2008-78844

SUMMARY OF INVENTION

Technical Problem

Thus, the present invention has an object to provide a power source circuit that reduces imbalance of a circuit by an excess current protection element, and reduces common mode noise.

Solution to Problem

In order to achieve the object, according to an aspect of the present invention, a power source circuit comprises: a pair of power supply lines; a ground line; a power conversion circuit converting an alternating voltage inputted through the pair of power supply lines into a direct current voltage by a switching operation; and an excess current protection element provided on a one of the pair of power supply lines, wherein a series circuit comprising a first line bypass capacitor and a resistor element serially connected is arranged between the ground line and the one of the pair of power supply lines, a second line bypass capacitor is arranged between the ground line and the other of the pair of power supply lines, capacitances of the first and second line bypass capacitors are set to be equal, and a resistance value r [Ω] of the resistor element meets a relation:

$$L/100C \le r \le 3L/100C,$$

wherein L [H] is an inductance value of the excess current protection element, and
C [F] is a capacitance value of each of the first and second line bypass capacitors.

Advantageous Effects of Invention

According to the present invention, imbalance between a pair of power supply lines by an excess current protection element can be corrected, and common mode noise generated by the imbalance can be reduced.

Further features of the present invention will become apparent from the following description of exemplary embodiments with reference to the attached drawings.

DESCRIPTION OF EMBODIMENTS

Figure 1:
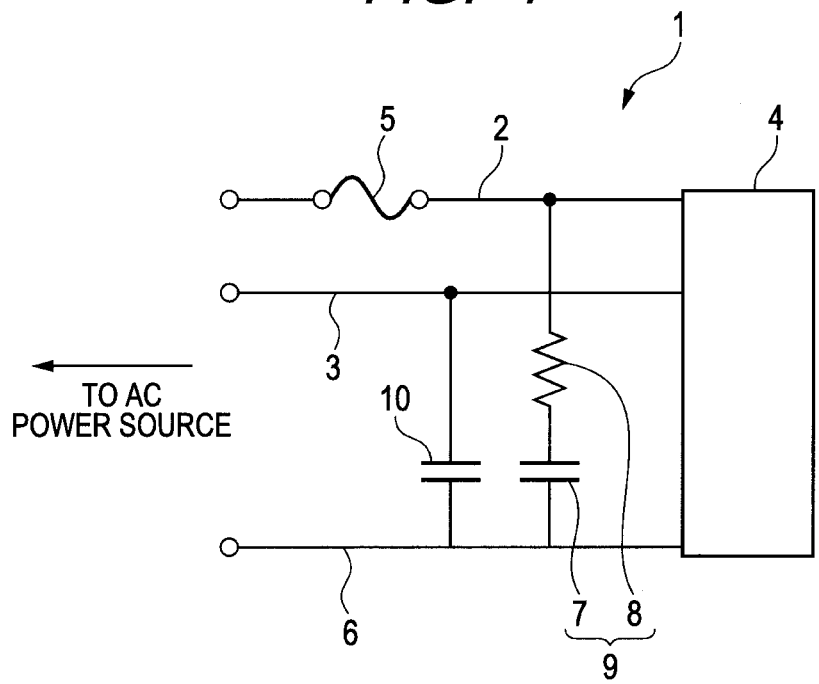
FIG. 1 is an electric circuit diagram illustrating a schematic configuration of a power source circuit of the present invention.

Now, an embodiment for carrying out the present invention will be described in detail with reference to the drawings. FIG. 1 is an electric circuit diagram illustrating a schematic configuration of a power source circuit according to the embodiment of the present invention. In FIG. 1, a power source circuit 1 includes a pair of power supply lines 2 and 3 connected to an alternating power source, and a switching circuit 4 as a power conversion circuit that converts an alternating voltage from an alternating power source input through the pair of power supply lines 2 and 3 into a direct current voltage. The alternating power source is, for example, a power source for commercial use. The switching circuit 4 includes, for example, a rectifying circuit having a bridge diode (not shown), a smoothing capacitor (not shown), and a DC-DC converter circuit (not shown) including a switching element. The rectifying circuit converts an alternating voltage into a direct current voltage, and the smoothing capacitor smoothes the direct current voltage converted by the rectifying circuit. The DC-DC converter circuit can output a predetermined direct current voltage by increasing or decreasing the smoothed direct current voltage by a switching operation.

The power source circuit 1 includes a fuse 5 as an excess current protection element provided in one positive power supply line 2 of the pair of power supply lines 2 and 3. The fuse 5 is, for example, a tubular fuse. The fuse 5 has a higher inductance value than wiring that constitutes the power supply lines 2 and 3.

The power source circuit 1 includes a series circuit 9 connected between the positive power supply line 2 and the ground (GND) 6. The series circuit 9 includes a first line bypass capacitor (hereinafter referred to as "first Y capacitor") 7 and a resistor element 8 connected in series, one end of the series circuit 9 is connected to a portion between the fuse 5 and the switching circuit 4 in the power supply line 2, and the other end of the series circuit 9 is connected to the GND 6. The resistor element 8 is a fixed resistance element.

The power source circuit 1 includes a second line bypass capacitor (hereinafter referred to as "second Y capacitor") 10 connected between a negative power supply line 3 and the GND 6.

An inductance value of the fuse 5 is L [H]. A capacitance value of the first Y capacitor 7 connected to the positive power supply line 2 is $C_1$ [F], a resistance value of the resistor element 8 is r [Ω], and a capacitance value of the second Y capacitor 10 connected to the negative power supply line 3 is $C_2$ [F]. A voltage of noise generated by the switching circuit 4 as a power conversion circuit is V [V], an angular frequency of the noise is ω [rad/s], and an output impedance of an alternating power source seen from the side of each of the power supply lines 2 and 3 is 50[Ω]. At this time, a current [A] flowing through the GND 6 as common mode noise that causes terminal noise or unwanted electromagnetic waves is expressed by (Expression 1) below.

$$I = \left| \frac{(\omega^2(50rC_1C_2 - LC_1) + j\omega(50C_1 - 50C_2))}{100 + j\omega(100rC_1 + 2500C_1 + 2500C_2 + L) - \omega^2(2500rC_1C_2 + rLC_1 + 50LC_1 + 50LC_2) - j50\omega^3 rLC_1C_2} \right| V \quad \text{(Expression 1)}$$

From this (Expression 1), a relation for reducing the current flowing through the GND 6 is expressed by (Expression 2) below.

$$50rC_1C_2 - LC_1 = 0 \text{ and } 50C_1 - 50C_2 = 0 \quad \text{(Expression 2)}$$

Thus, the resistance value r of the resistor element 8 is set with respect to the inductance value L of the fuse 5, the capacitance value $C_1$ of the first Y capacitor 7, and the capacitance value $C_2$ of the second Y capacitor 10 so as to meet a relation in (Expression 3) below, thereby reducing common mode noise.

$$r = \frac{L}{50C_2} \text{ and } C_1 = C_2 \quad \text{(Expression 3)}$$

Since the capacitance value $C_1$ of the first Y capacitor 7 is equal to the capacitance value $C_2$ of the second Y capacitor 10, the capacitance value of each of the Y capacitors 7 and 10 is C ($=C_1=C_2$) [F], and the resistance value r of the resistor element 8 is set to meet a relation in (Expression 4) below, thereby reducing common mode noise.

$$r = \frac{L}{50C} \quad (C_1 = C_2 = C) \quad \text{(Expression 4)}$$

It is difficult to specify an actual precise value of the output impedance of the alternating power source to which the power source circuit 1 is connected, and setting a resistance value r of the resistor element 8 which is variable depending on the output impedance of the alternating power source increases size of an apparatus and costs. Thus, in this embodiment, an output impedance of an alternating power source is generally set around 50[Ω], and the resistance value r of the resistor element 8 is set with the output impedance of the alternating power source seen from the side of each of the power supply lines 2 and 3 being 50 [Ω].

As such, placing the resistor element 8 having the resistance value r can reduce common mode noise, and also can most effectively reduce common mode noise when the output impedance of the alternating power source is 50[Ω].

Equally setting the capacitance values of the first Y capacitor 7 and the second Y capacitor 10 to the capacitance value C includes using capacitor elements having a nominal value of the capacitance value C. Specifically, if there is a difference in capacitance value of the extent of a tolerable difference between the capacitor elements, but the capacitor elements have the same nominal value, the capacitance values of the first Y capacitor 7 and the second Y capacitor 10 are equally set.

Figure 2:
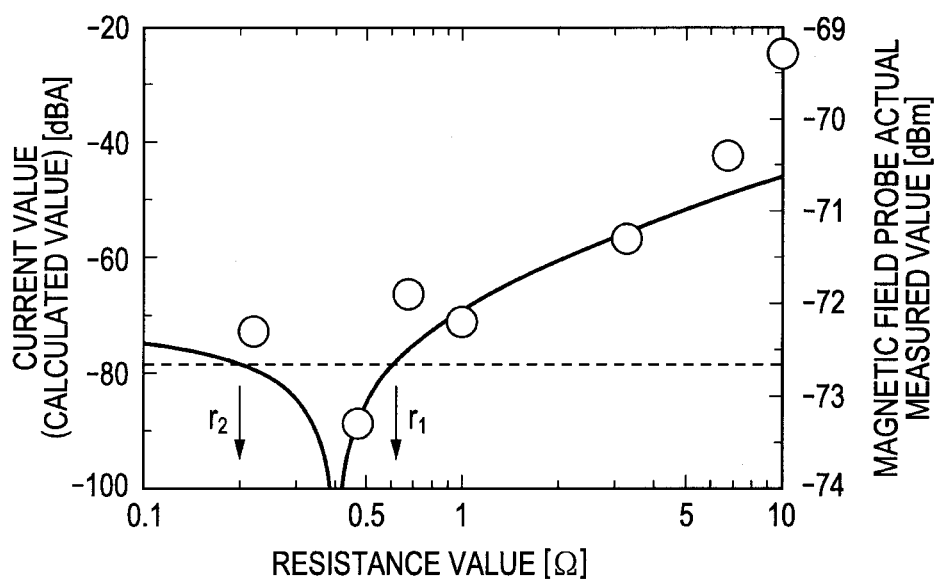
FIG. 2 is a graph illustrating a relation between a resistance value of a resistor element and an amount of current of noise of the power source circuit of the present invention.

Next, a specific effect of reducing common mode noise in the configuration of the power source circuit 1 will be described. First, from (Expression 1), a relation between the resistance value of the placed resistor element 8 and the value of the current flowing through the GND 6 is illustrated in FIG. 2. Capacitance values $C_1$ and $C_2$ of the Y capacitors 7 and 10 connected to the positive and negative power supply lines 2 and 3 are 1000 [pF], and the inductance value L of the fuse 5 is 20 [nH] from actual measurement. The noise generated from the switching circuit 4 was input from a signal generator in a pseudo manner, and a simulation was performed with a voltage of 1 [V] and a frequency of 10 [MHz] as an example. A relation between the resistor element 8 and the value of the current flowing through the GND 6 calculated from (Expression 1) is shown by a solid line. When the resistance value of the resistor element 8 calculated by (Expression 4) is r=0.4 [Ω], it can be found that the current value is the smallest.

Next, the power source circuit 1 was actually prepared and effects were confirmed by actual measurement. Magnetic field strength correlated with the current flowing through the GND 6 when the resistance value r of the resistor element 8 is 0, 0.22, 0.47, 0.68, 1, 3.3, 6.8, 10[Ω] was measured using a magnetic field probe and a spectrum analyzer. The actual measurement result is plotted by white circles in FIG. 2. The actual measured value has a similar tendency to the calculated value, and the result shows that placement of the resistor element 8 has an effect of reducing the value of the current flowing through the GND 6, specifically, reducing common mode noise as compared with the case without the resistor element 8 (r=0).

In this embodiment, a range of the resistance value r of the resistor element 8 is calculated having an effect of 6 dB or more, which can expect a sufficient effect of reducing terminal noise and unwanted radiation. In FIG. 2, the value shown by the broken line is a value obtained by subtracting 6 dB from the value of the current flowing through the GND 6 when the resistor element 8 is not placed. The range of the resistance value r of the resistor element 8 to be calculated is between resistance values $r_1$ [Ω] and $r_2$ [Ω] at two points of intersection of the solid line and the broken line. The resistance values $r_1$ and $r_2$ are calculated by solving (Expression 5) below using (Expression 1).

$$I(r) = \frac{1}{2} \times I\Big|_{r=0} \quad \text{(Expression 5)}$$

However, (Expression 5) is very complicated, and it is difficult to solve (Expression 5) by algebraic operation. Then, in (Expression 5), numerical values are assigned to parameters to calculate a relation between the resistance values $r_1$ and $r_2$ [Ω] and an angular frequency ω [rad/s] of noise, an inductance value L [H] of the fuse 5, and the capacitance values $C_1$ and $C_2$ [F] of the first and second Y capacitors 7 and 10.

Figure 3:
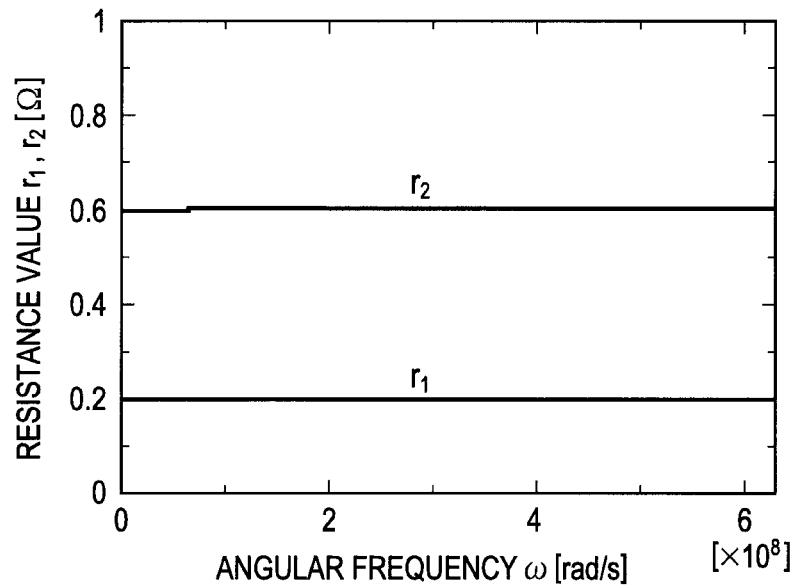
FIG. 3 is a graph illustrating a relation between the resistance value of the resistor element and an angular frequency of noise of the power source circuit of the present invention.

First, the relation between the resistance values $r_1$ and $r_2$ and the angular frequency ω of noise will be described. FIG. 3 shows the angular frequency ω of noise on the abscissa, and the resistance values $r_1$ and $r_2$ on the ordinate. The inductance value L of the fuse 5 is 20 [nH], and the capacitance values $C_1$ and $C_2$ of the first and second Y capacitors 7 and 10 are 1000 [pF]. The graph shows that the resistance values $r_1$ and $r_2$ do not depend on the angular frequency ω.

Figure 4:
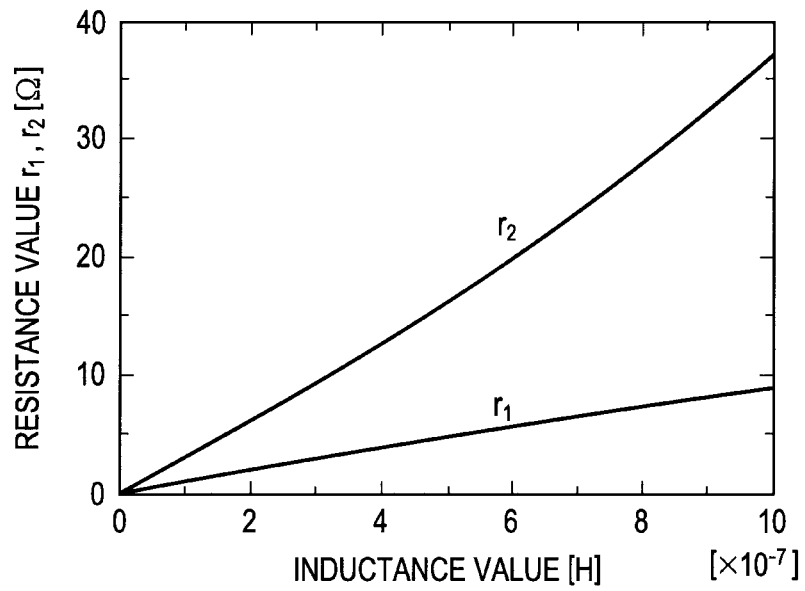
FIG. 4 is a graph illustrating a relation between the resistance value of the resistor element and an inductance value of a fuse of the power source circuit of the present invention.

Next, relations between the resistance values $r_1$ and $r_2$ and the inductance value L of the fuse 5 will be described. FIG. 4 shows the inductance value L of the fuse 5 on the abscissa, and the resistance values $r_1$ and $r_2$ on the ordinate. The frequency ω/2π of the noise is 10 [MHz], and the capacitance values $C_1$ and $C_2$ [F] of the first and the second Y capacitors 7 and 10 are 1000 [pF]. This graph shows that the resistance values $r_1$ and $r_2$ are proportional to the inductance value L.

Figure 5:
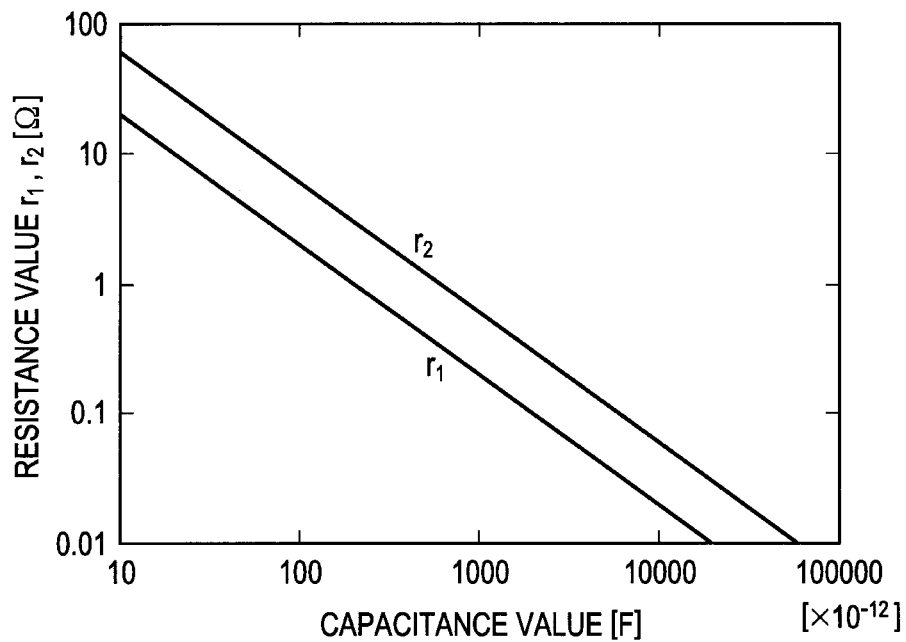
FIG. 5 is a graph illustrating a relation between the resistance value of the resistor element and capacitance values of first and second Y capacitors of the power source circuit of the present invention.

Finally, relations between the resistance values $r_1$ and $r_2$ and the capacitance values $C_1$ and $C_2$ of the first and second Y capacitors 7 and 10 will be described. FIG. 5 shows a graph with the capacitance value C (=$C_1$=$C_2$) of the Y capacitors 7 and 10 on the abscissa and the resistance values $r_1$ and $r_2$ on the ordinate when the capacitance value $C_1$ is equal to the capacitance value $C_2$. The frequency ω/2π of the noise is 10 [MHz] and the inductance value L of the fuse 5 is 20 [nH]. The graph shows that the resistance values $r_1$ and $r_2$ are inversely proportional to the capacitance value C (=$C_1$=$C_2$).

Figure 6:
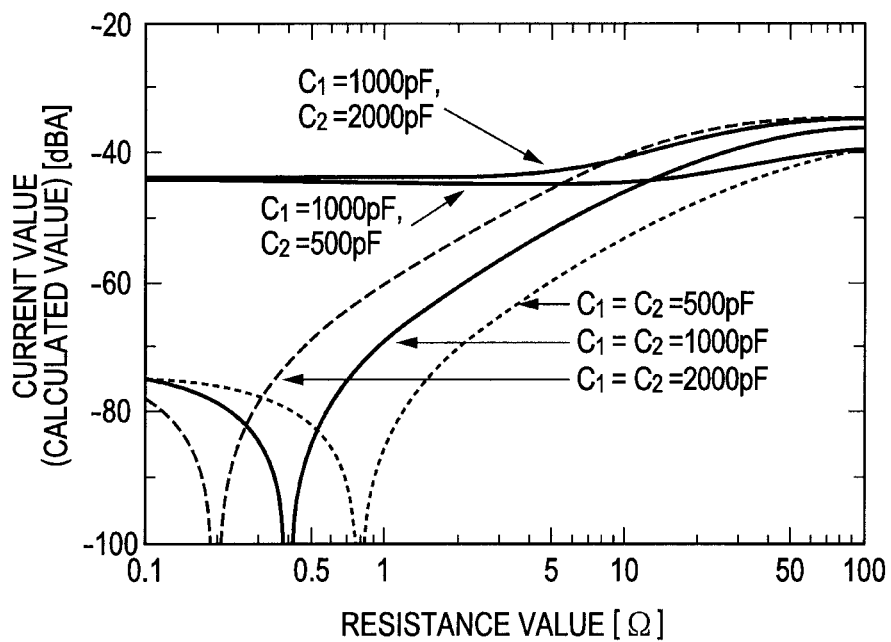
FIG. 6 is a graph illustrating a relation between the resistance value of the resistor element and a current value of the ground by comparing a case where capacitance values of the first Y capacitor and the second Y capacitor are set to be equal and a case where the capacitance values of the first Y capacitor and the second Y capacitor are different.
Figure 7:
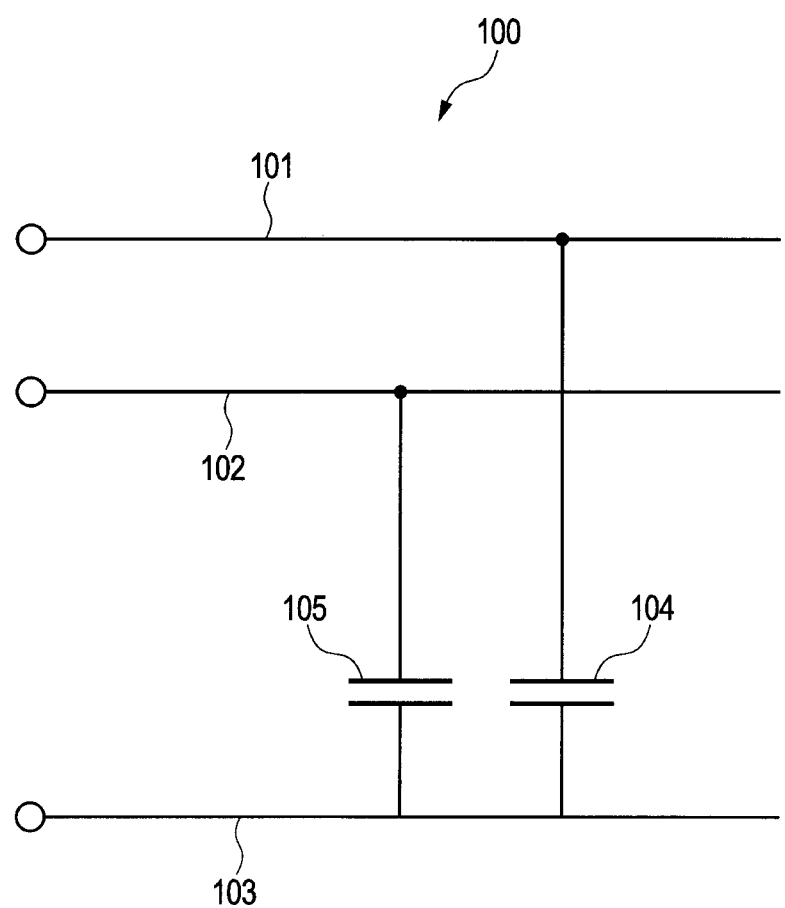
FIG. 7 is an electric circuit diagram illustrating a filter circuit of a conventional power source circuit.

The case where the capacitance value $C_1$ is not equal to the capacitance value $C_2$ will be described. FIG. 6 shows values of the current flowing through the GND 6 when the capacitance value $C_1$ and the capacitance value $C_2$ are changed from (Expression 1) in various ways. When there is a deviation between the capacitance value $C_1$ and the capacitance value $C_2$, it can be found that placing the resistor element 8 does not reduce the value of the current flowing through the GND 6.

Thus, when the capacitance value $C_1$ is equal to the capacitance value $C_2$, an effect of reducing common mode noise can be obtained.

From the above result, the resistance values $r_1$ and $r_2$ are expressed by a relation in (Expression 6) below, where $a_1$ and $a_2$ are constant.

$$r_1 = a_1 \times \frac{L}{C}, \quad r_2 = a_2 \times \frac{L}{C} \quad (C_1 = C_2 = C) \quad \text{(Expression 6)}$$

From the results in FIGS. 4 and 5, the constants $a_1$ and $a_2$ are approximately as expressed in (Expression 7) below.

$$a_1 = \frac{1}{100}, \quad a_2 = \frac{3}{100} \quad \text{(Expression 7)}$$

Thus, the range of the resistance value r of the resistor element 8 having an effect of 6 dB or more, specifically, with half or less common mode noise current of that in the case without the resistor element 8 is expressed in (Expression 8) below.

$$\frac{L}{100C} \leq r \leq \frac{3L}{100C} \quad (C_1 = C_2 = C) \quad \text{(Expression 8)}$$

When 1000 [pF] is assigned to the capacitance values $C_1$ and $C_2$ of the Y capacitors 7 and 10 as a condition of actual measurement, and 20 [nH] is assigned to the inductance value L of the fuse 5 in (Expression 8), 0.2[Ω]<r<0.6[Ω] is obtained, which matches the result in FIG. 2. From the above, the resistor element 8 having the resistance value r within the range obtained by (Expression 8) can be placed to correct imbalance between the pair of power supply lines 2 and 3 by the fuse 5, and reduce common mode noise generated by the imbalance. Then, the resistor element 8 having the resistance value r (nominal value r) that can be calculated by (Expression 4) can be placed to more effectively reduce common mode noise.

The present invention has been described based on the above embodiment, but the present invention is not limited to this. In the embodiment, the case where one power supply line is positive, and the other power supply line is negative is described, but the present invention may be applied to the case where one power supply line is negative, and the other power supply line is positive.

In the embodiment, the case where the switching circuit as a power conversion circuit converts the alternating voltage into the direct current voltage, and further increases or decreases the direct current voltage is described, but the input alternating voltage may be converted into an alternating voltage of a different frequency. In this case, the power conversion circuit includes a rectifying circuit and a smoothing capacitor, and also includes a DC-DC converter as required. Further, the power conversion circuit includes an inverter circuit including a switching element, and converts a direct current voltage into an alternating voltage of a different frequency from that of an alternating voltage of the alternating power source by a switching operation, which generates noise. Thus, the invention can be also applied to this case.

In the embodiment, the case of the tubular fuse as the excess current protection element is described, but not limited to this, the invention may be applied to any fuses such as a chip fuse. Also, the present invention may be applied to any excess current protection elements such as a PTC element other than a fuse.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-020570, filed Feb. 2, 2011, which is hereby incorporated by reference herein in its entirety.

The invention claimed is:

1. A power source circuit comprising:
   a pair of power supply lines;
   a ground line;
   a power conversion circuit converting an alternating voltage inputted through the pair of power supply lines into a direct current voltage by a switching operation; and
   an excess current protection element provided on a one of the pair of power supply lines, wherein
   a series circuit comprising a first line bypass capacitor and a resistor serially connected is arranged between the ground line and the one of the pair of power supply lines,
   a second line bypass capacitor is arranged between the ground line and the other of the pair of power supply lines,
   capacitances of the first and second line bypass capacitors are set to be substantially equal, and
   a resistance value r [Ω] of the resistor meets a relation:

$L/100C \leq r \leq 3L/100C$, wherein

L [H] is an inductance value of the excess current protection element, and C [F] is a capacitance value of one of the first and second line bypass capacitors.

2. The power source circuit according to claim 1, wherein the resistance value r of the resistor element meets a relation:

$r = L/50C$.

3. The power source circuit according to claim 1, wherein each of the resistor, the first line bypass capacitor and the second line bypass capacitor are an element.

* * * * *